US008742388B2

(12) United States Patent
Lee

(10) Patent No.: US 8,742,388 B2
(45) Date of Patent: Jun. 3, 2014

(54) VARIABLE RESISTANCE MEMORY DEVICES

(75) Inventor: Jaekyu Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 335 days.

(21) Appl. No.: 13/241,826

(22) Filed: Sep. 23, 2011

(65) Prior Publication Data

US 2012/0145985 A1    Jun. 14, 2012

(30) Foreign Application Priority Data

Dec. 8, 2010    (KR) .................. 10-2010-0125007

(51) Int. Cl.
*H01L 45/00*    (2006.01)

(52) U.S. Cl.
USPC ............. 257/4; 257/3; 257/E45.002; 365/148

(58) Field of Classification Search
CPC .... H01L 45/06; H01L 27/2463; H01L 45/144
USPC .................................. 257/2, 3, 4, 5, E45.002
See application file for complete search history.

(56) References Cited

U.S. PATENT DOCUMENTS

| 7,811,879 | B2 * | 10/2010 | Lam et al. ................ 438/234 |
| 8,203,135 | B2 * | 6/2012 | Sim et al. ................ 257/4 |
| 2006/0186483 | A1 * | 8/2006 | Cho et al. ................ 257/390 |
| 2009/0008622 | A1 | 1/2009 | Kim |
| 2010/0176362 | A1 * | 7/2010 | Lung et al. ................ 257/2 |

FOREIGN PATENT DOCUMENTS

| KR | 20080100054 A | 11/2008 |
| KR | 20090004158 A | 1/2009 |
| KR | 20100053792 A | 5/2010 |

* cited by examiner

*Primary Examiner* — Jerome Jackson, Jr.
*Assistant Examiner* — Paul Budd
(74) *Attorney, Agent, or Firm* — Harness, Dickey & Pierce, P.L.C.

(57) ABSTRACT

Variable resistance memory devices may include a semiconductor layer including first, second, third doped regions, a variable resistance pattern on the semiconductor layer, a lower electrode between the semiconductor layer and the variable resistance pattern, and a first metal silicide pattern in contact with the semiconductor layer. The third doped region may be spaced apart from the first metal silicide pattern, the first doped region may be spaced apart from the third doped region, and a second doped region may be interposed between the first and third doped regions and be in contact with the first metal silicide pattern. The first doped region may have the same conductivity type as the third doped region and a different conductivity type from the second doped region.

11 Claims, 13 Drawing Sheets

VARIABLE RESISTANCE MEMORY DEVICES

CROSS-REFERENCE TO RELATED APPLICATION

This application claims priority under 35 U.S.C. §119 to Korean Patent Application No. 10-2010-0125007, filed on Dec. 8, 2010, in the Korean Intellectual Property Office (KIPO), the entire disclosure of which is incorporated herein by reference.

BACKGROUND OF THE INVENTION

1. Field

Example embodiments of the inventive concepts relate generally to memory semiconductor devices. More particularly, example embodiments of the inventive concepts relate to variable resistance memory devices (VRMD) and methods of fabricating the same.

2. Description of the Related Art

Semiconductor memory devices are generally classified into volatile memory devices and nonvolatile memory devices. Volatile memory devices may lose their stored data when their power supply is interrupted. Volatiles memory devices may, for example, include a dynamic random access memory (DRAM) and a static random access memory (SRAM). Nonvolatile memory devices may maintain their stored data even when their power supply is interrupted. Nonvolatile memory devices may, for example, include a programmable read only memory (PROM), an erasable PROM (EPROM), an electrically EPROM (EEPROM) and a flash memory device.

Semiconductor memory devices may, for example, include a ferroelectric random access memory (FRAM), a magnetic random access memory (MRAM) and a phase change random access memory (PRAM). Material constituting these semiconductor memory devices may have a different resistance depending on a current forced thereto or a voltage applied thereto, and may have a characteristic maintaining a resistance even when a current supply or a voltage supply is interrupted.

SUMMARY

Example embodiments of the inventive concepts may provide variable resistance memory devices with an improved electric property and/or enhanced reliability. Other example embodiments of the inventive concepts may provide methods of fabricating variable resistance memory devices with an improved electric property and/or enhanced reliability.

According to an example embodiment of the inventive concepts, a variable resistance memory device may include a semiconductor layer including a first doped region, at least one second doped region, and at least one third doped region, a variable resistance pattern on the semiconductor layer, at least one lower electrode between the semiconductor layer and the variable resistance pattern, and a first metal silicide pattern in contact with the semiconductor layer. The third doped region may be spaced apart from the first metal silicide pattern, the first doped region may be spaced apart from the third doped region, and a second doped region may be interposed between the first and third doped regions and be in contact with the first metal silicide pattern. The first doped region may have the same conductivity type as the third doped region and a different conductivity type from the second doped region.

According to some example embodiments, the first metal silicide pattern may be spaced apart from the lower electrode and the first doped region, and the lower electrode may be spaced apart from the second doped region. According to other example embodiments, the second doped region may include a lightly doped region in contact with the third doped region and a heavily doped region spaced apart from the third doped region. According to still other example embodiments, the first metal silicide pattern may be in contact with the heavily doped region and spaced apart from the lightly doped region. According to even other example embodiments, the lightly doped region may be provided on the first doped region, the heavily doped region may be provided on the lightly doped region, and the first metal silicide pattern may be provided on the heavily doped region.

According to yet other example embodiments, the device may further include a contact hole penetrating the first metal silicide pattern and the heavily doped region to expose the lightly doped region. The third doped region may be provided in the lightly doped region under the contact hole. According to further example embodiments, the device may further include a contact hole penetrating the first metal silicide pattern and the heavily doped region to expose the lightly doped region, and the third doped region may be provided in the contact hole. According to still further example embodiments, the device may further include an insulating spacer disposed on a sidewall of the contact hole. According to even further example embodiments, the device may further include a second metal silicide pattern interposed between the lower electrodes and the third doped region and being in contact with the third doped region.

According to yet further example embodiments, the device may further include conductive lines disposed on the variable resistance pattern, and the conductive line may extend to cross the first metal silicide pattern and the first metal silicide pattern extends to cross the conductive line. According to yet further example embodiments, the at least one lower electrode may include a plurality of lower electrodes arranged two-dimensionally on the semiconductor layer, and the at least one third doped region includes a plurality of third doped regions, each of which may be disposed below the respective lower electrodes and separated from each other. According to yet further example embodiments, the at least one second doped region may include a plurality of second doped regions separated from each other by a device isolation layer and configured to extend parallel to the first metal silicide pattern.

According to other example embodiments of the inventive concepts, a method of fabricating a variable resistance memory device may include forming second doped regions in a substrate, forming a metal silicide pattern in contact with the second doped region, forming a contact hole penetrating the metal silicide pattern to expose the second doped region, forming an insulating spacer on a sidewall of the contact hole, forming a lower electrode in the contact hole, forming a phase changeable material pattern on the lower electrode, and forming a third doped region having a different conductivity type from the second doped region between the second doped regions and the lower electrode.

According to some example embodiments, the third doped region and the substrate have a first conductivity type, and the second doped region has a second conductivity type different from the first conductivity type. According to other example embodiments, the forming of the second doped regions may include forming a lightly doped region to a first depth from a top surface of the substrate and forming a heavily doped region to a second depth less than the first depth from the top surface of the substrate. According to still other example embodiments, the forming of the contact hole may include performing a first etch step using the metal silicide pattern as an etch stop layer and performing a second etch step to expose the lightly doped region.

According to even other example embodiments, the method may further include forming a device isolation layer between the second doped regions. The forming of the metal silicide pattern may include recessing an upper portion of the device isolation layer to a depth less than the first depth. According to yet other example embodiments, the forming of the third doped region may include doping a portion of the second doped region exposed by the contact hole with impurities of the first conductivity type. According to further example embodiments, the third doped region may be formed on the second doped region exposed by the contact hole. According to still further example embodiments, the forming of the third doped region may include forming a semiconductor epitaxial layer on the second doped region using a selective epitaxial growth technique, and a lower portion of the semiconductor epitaxial layer may be formed to have the same conductivity type as the second doped region.

According to at least one embodiment, a variable resistance memory device, includes a semiconductor layer, a variable resistance element on the semiconductor layer, a bipolar junction transistor (BJT) at least partially in the semiconductor layer, an emitter of the BJT connected to an electrode of the variable resistance element, and a silicide layer on the semiconductor layer, a base of the BJT being connected to the silicide layer, the base and the emitter separating the variable resistance element from the silicide layer.

According to at least one example embodiment, a variable resistance memory device includes a semiconductor layer with a first doped region of a first conductivity type, at least one second doped region of a second conductivity type, and at least one third doped region of the first conductivity type, the first doped region being spaced apart from the third doped region, the second doped region being between the first and third doped regions, a variable resistance pattern on the semiconductor layer, at least one lower electrode between the semiconductor layer and the variable resistance pattern, and a first metal silicide pattern in contact with the semiconductor layer, the first metal silicide pattern being spaced apart from the third doped region, the second doped region being in contact with the first metal silicide pattern.

According to at least one example embodiment, a method of fabricating a variable resistance memory device includes forming a first doped region of a first conductivity type in a substrate, forming a metal silicide pattern in contact with the first doped region, forming a contact hole penetrating the metal silicide pattern to expose the first doped region, forming an insulating spacer on a sidewall of the contact hole, forming a lower electrode in the contact hole, forming a phase change material pattern on the lower electrode, and forming a second doped region of a second conductivity type between the first doped region and the lower electrode.

BRIEF DESCRIPTION OF THE DRAWINGS

Example embodiments will be more clearly understood from the following brief description taken in conjunction with the accompanying drawings.

FIG. 1 is an equivalent circuit diagram illustrating memory cell arrays of variable resistance memory devices (VRMDs) according to example embodiments of the inventive concepts;

FIG. 2 is a plan view illustrating a memory cell array of a VRMD according to example embodiments of the inventive concepts;

FIG. 3 is a sectional view illustrating VRMDs according to example embodiments of the inventive concepts;

FIG. 4 is a cross-sectional diagram illustrating VRMDs according to other example embodiments of the inventive concepts;

FIGS. 5-10 are cross-sectional diagrams illustrating methods of fabricating VRMDs according to example embodiments of the inventive concepts;

FIG. 11 is a cross-sectional view illustrating VRMDs according to still other example embodiments of the inventive concepts;

FIG. 12 is a cross-sectional view illustrating VRMDs according to further example embodiments of the inventive concepts; and FIG. 13 is a block diagram illustrating memory systems including VRMDs according to example embodiments of the inventive concepts.

Figure 1:
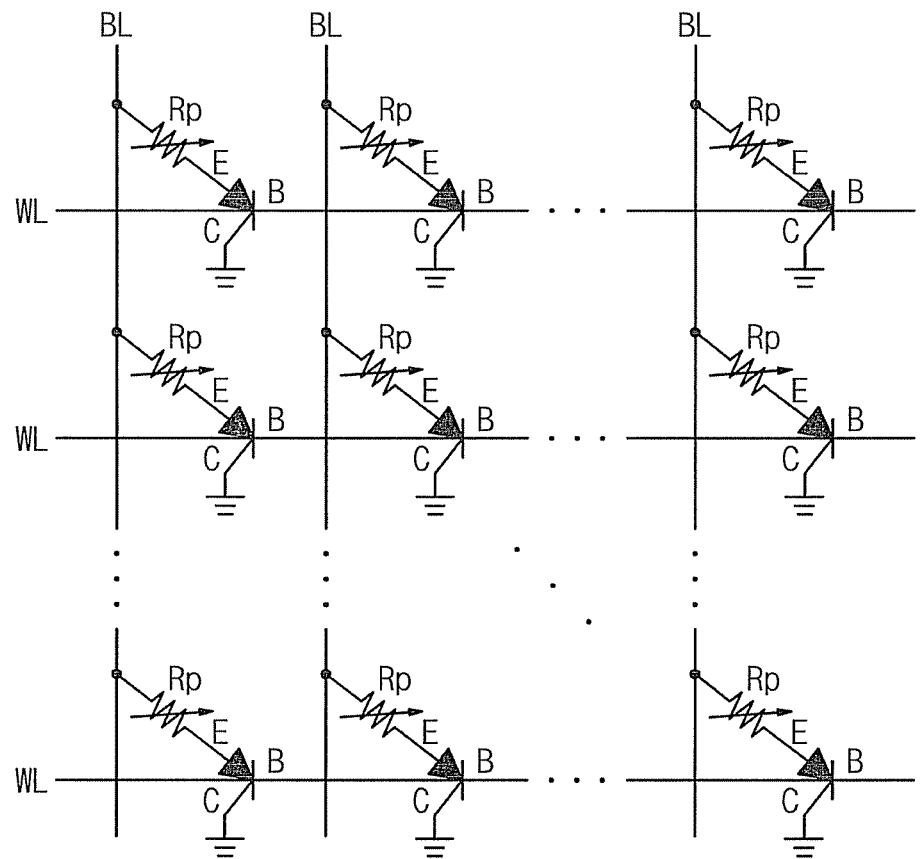
FIGS. 1-13 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, example embodiments are described with reference to a phase change memory device. Example embodiments of the inventive concepts are not limited thereto. For example, other variable resistance memory devices (e.g., FRAM and/or MRAM) are included within the scope of example embodiments of the inventive concepts.

FIG. 1 is an equivalent circuit diagram illustrating memory cell arrays of variable resistance memory devices (VRMDs) according to example embodiments. Referring to FIG. 1, a VRMD may include a plurality of bit lines BL, at least one word line WL crossing the plurality of the bit lines BL, and memory cells at intersections of the bit lines BL and a word line WL, respectively. The memory cells may include a variable resistor Rp as a memory element. The variable resistor Rp may include a variable resistance material. The resistance and/or crystalline structure of the variable resistance material may be reversibly changed by an applied signal, for example, an electric signal (e.g., a voltage, an electric current, an optical signal and/or radiation). According to some example embodiments, the variable resistor Rp may include a phase changeable material (e.g., chalcogenides and/or alloys of germanium, antimony and tellurium (GST)).

The variable resistor Rp may include a portion connected to one of the bit lines BL and another portion connected to one of the word lines WL via a selection device. According to some example embodiments of the inventive concept, a bipolar junction transistor (BJT) may be used as the selection device. The BJT may include an emitter E, a base B, and a collector C. According to some example embodiments, the emitter E may be connected to a portion of the variable resistor Rp, and the collector C may be grounded. The base B may be connected to the word line WL or provided as a portion of the word line WL.

Figure 2:
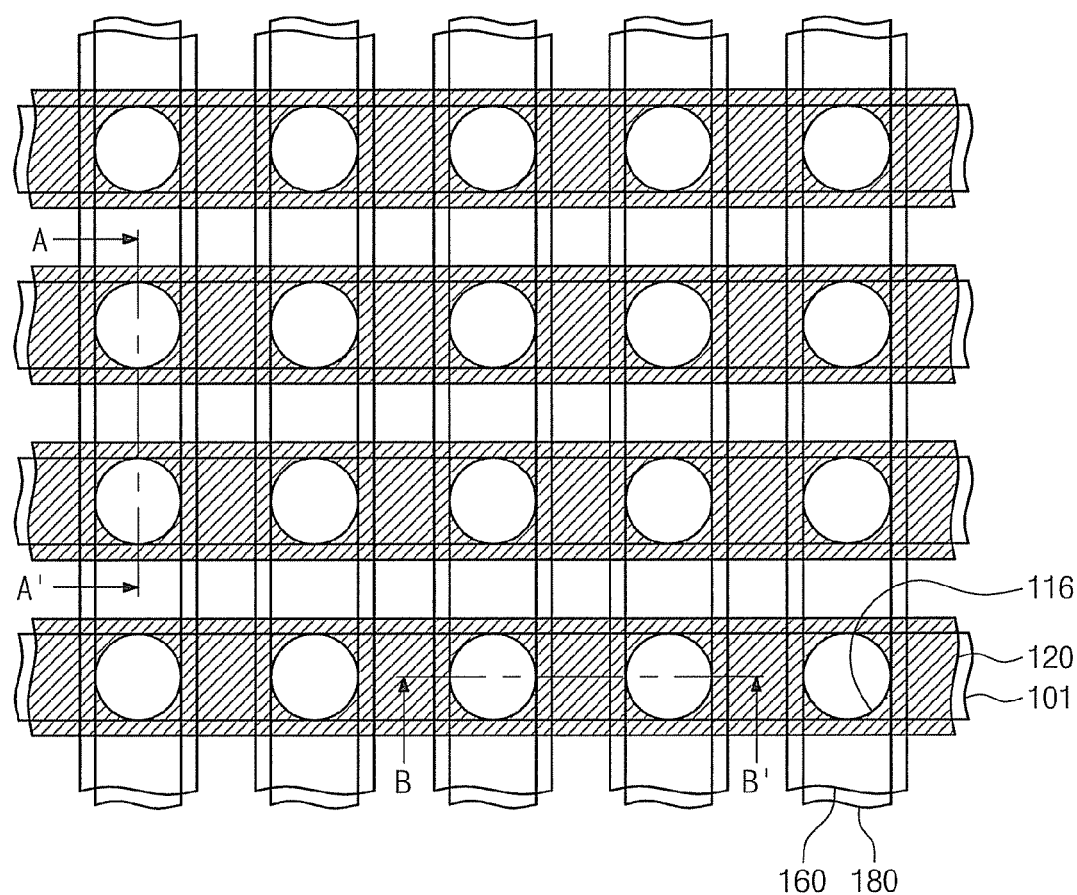
Figure 3:
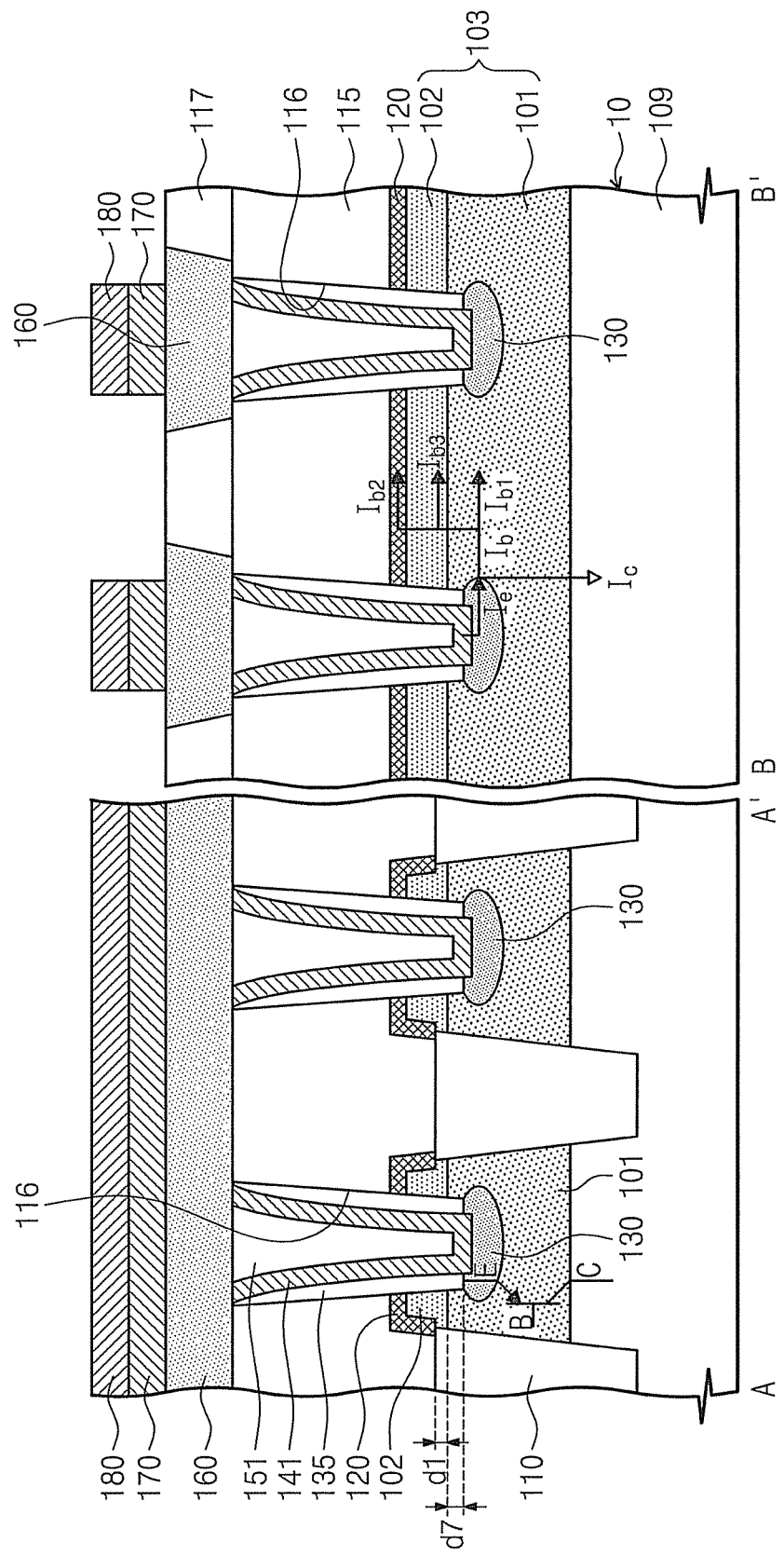

FIG. 2 is a plan view illustrating a memory cell array of a VRMD according to example embodiments of the inventive concepts. FIG. 3 is a sectional view illustrating VRMDs according to example embodiments of the inventive concepts. A selection device may be on a substrate 10. The substrate 10 may be, for example, a semiconductor-based structure. The substrate 10 may include silicon, silicon germanium (SiGe), germanium (Ge) and/or gallium arsenic (GaAs). A silicon-on-insulator (SOI) wafer may be used as the substrate 10. The substrate 10 may be doped with impurities of a first conductivity type. For example, the substrate 10 may be a p-type silicon wafer lightly doped with p-type impurities.

The selection device may be a bipolar junction transistor (BJT). The selection device may include a first doped region 109, a second doped region 103, and a third doped region 130. During operation of the memory device, the first, second and third doped regions 109, 103 and 130 may be used as a collector C, a portion of a base B, and an emitter E of the BJT, respectively. The first, second and third doped regions 109, 103 and 130 of the selection device may be in the substrate 10 and/or in an additional semiconductor layer, which may be on the substrate 10. For concise description, the selection device provided in the substrate 10 will be described hereinafter, although example embodiments are not limited thereto.

The first doped region 109 may be a lightly doped region of the first conductivity type. For example, the first doped region 109 may have a conductivity type of p-type. In the case that the first, second and third doped regions 109, 103 and 130 are formed in the substrate 10, the substrate 10 of the first conductivity type may be used as the first doped region 109. For example, a portion of the substrate 10 except for the second and third doped regions 103 and 130 may be used as the first doped region 109.

The second doped regions 103 may be separated from each other by device isolation layers 110, and each doped region 103 may be extend along a first direction (e.g., a direction parallel to the line B-B' shown in the FIG. 2). The second doped regions 103 may extend along the first direction and electrically connect to a lower portion of memory cells, respectively. According to some example embodiments, the second doped region 103 may be a portion of the word line WL. The second doped regions 103 may be a different conductivity type (hereinafter, a second conductivity type) from the first conductivity type. For example, the second doped regions 103 may be n-type impurity regions.

The second doped regions 103 may include a lightly doped region 101 of the second conductivity type and a heavily doped region 102 of the second conductivity type. For example, an impurity concentration of the heavily doped region 102 may be about 10 to 100 times higher than that of the lightly doped region 101. The heavily doped region 102 may be in the uppermost portion of the substrate 10, and the lightly doped region 101 may be formed between the heavily doped region 102 and the first doped region 109 (e.g., a bulk region of the substrate 10).

A bottom surface of the device isolation layer 110 may be lower than that of the second doped region 103, and a top surface of the device isolation layer 110 may be lower than that of the substrate 10. According to some example embodiments, the top surface of the device isolation layer 110 may be higher by a distance d1 than a top surface of the lightly doped region 101. The device isolation layers 110 may be formed not to expose the lightly doped region 101. The device isolation layers 110 may include, for example, a silicon oxide layer. According to some example embodiments, a deposition technique with a gap-fill property (e.g., a high density plasma chemical vapor deposition (HDP CVD)) may be used to form a silicon oxide layer for the device isolation layers 110.

First metal silicide patterns 120 may be on the second doped regions 103. The first metal silicide patterns 120 may be in contact with the heavily doped region 102. The first metal silicide patterns 120 may be spaced apart from the lightly doped region 101 by the distance d1 due to the heavily doped region 102 interposed therebetween. The first metal silicide patterns 120 may extend along the first direction parallel to a running direction of the second doped region 103. The first metal silicide pattern 120 may include a portion on the device isolation layer 110 adjacent thereto. The first metal silicide patterns 120 may be formed of metal silicide, for example, cobalt silicide, nickel silicide and/or titanium silicide.

The third doped regions 130 may be spaced apart from the first metal silicide patterns 120 and the first doped region 109. The third doped regions 130 may be in contact with the lightly doped region 101 and spaced apart from the heavily doped region 102 by a specific distance d7. For example, the third doped regions 130 may be provided in the lightly doped region 101. The third doped regions 130 may be of the first conductivity type. The third doped regions 130 may be the same conductivity type as the first doped region 109. For example, the third doped regions 130 may be p-type. The third doped regions 130 may be doped to a relatively higher p-type doping concentration than the first doped region 109.

Lower electrodes 141 may be formed on the substrate 10. The lower electrodes 141 may be in contact holes 116 penetrating a first interlayer dielectric 115. In a plan view, a shape of the contact hole 116 may be circular or elliptical, but example embodiments are not limited thereto. The lower electrodes 141 may penetrate the first metal silicide patterns 120 and the heavily doped region 102 and be connected to the third doped regions 130. For example, a bottom surface of the lower electrode 141 may be at a lower level than an interfacial boundary between the heavily doped region 102 and the lightly doped region 101.

An insulating spacer 135 may be between an inner sidewall of the contact hole 116 and the lower electrode 141. A bottom surface of the lower electrode 141 may be at a lower level than a lower surface of the insulating spacer 135. The lower electrodes 141 may be spaced apart from the first metal silicide patterns 120 by the insulating spacer 135. The lower electrodes 141 may not be in direct contact with the first metal silicide patterns 120. The lower electrodes 141 may be spaced apart from the second doped regions 103 by the insulating spacer 135. The lower electrodes 141 may not be in direct contact with the second doped regions 103.

The lower electrodes 141 may be two-dimensionally arranged on the substrate 10. For example, the lower electrodes 141 may be at intersections of the second doped regions 103 extending along the first direction and conductive lines extending along a second direction. According to some example embodiments, the lower electrode 141 may cover an inner sidewall of the insulating spacer 135 in the contact hole 116. The lower electrode 141 may partially fill the contact holes 116 with the insulating spacer 135. A remaining space of the contact hole 116 may be filled with an insulating gap-fill pattern 151. The insulating gap-fill pattern 151 may be at least one of a silicon oxide, a silicon nitride, and a silicon oxynitride. According to other example embodiments, the lower electrodes 141 may fill the contact holes 116 provided with the insulating spacer 135, and in this case, the insulating gap-fill pattern 151 may not be provided in the contact holes 116. A shape of the lower electrode 141 may be a bottom-closed cylindrical shape, but example embodiments are not limited thereto. In consideration of an electric connection between the substrate 10 and a variable resistance pattern, a shape of the lower electrode 141 may be modified by those skilled in the art. For example, a shape of the lower electrode 141 may be a 'U' shape, a line shape, and/or a half-ring shape.

The lower electrodes 141 may be, for example, at least one of a transition metal, a conductive transition metal nitride, and a conductive ternary nitride. The transition metal may include at least one of titanium (Ti), zirconium (Zr), hafnium (Hf), vanadium (V), niobium (Nb), tantalum (Ta), and tungsten (W). The conductive transition metal nitride may include at least one of titanium nitride (TiN), hafnium nitride (HfN), vanadium nitride (VN), niobium nitride (NbN), tantalum nitride (TaN), and tungsten nitride (WN). The conductive ternary nitride may include at least one of titanium aluminum nitride (TiAlN), titanium carbon nitride (TiCN), tantalum carbon nitride (TaCN), titanium silicon nitride (TiSiN) and tantalum silicon nitride (TaSiN).

Variable resistance patterns 160 may be formed on the lower electrodes 141. According to some example embodiments, the variable resistance patterns 160 may extend along a second direction (e.g., a direction parallel to the line A-A' shown in the FIG. 2), which may cross the first direction denoted by the line B-B' shown in the FIG. 2. However, a running direction and shape of the variable resistance pattern 160 are not limited thereto. The variable resistance pattern 160 may be between the lower electrode 141 and an upper electrode in various shapes. The variable resistance patterns 160 may be in a second interlayer dielectric 117. According to some example embodiments, the variable resistance patterns 160 may be a phase changeable material with a reversible crystal structure. The phase changeable material may be, for example, a compound including at least one of Te and Se, which are chalcogenide elements, and at least one of Ge, Sb, Bi, Pb, Sn, Ag, As, S, Si, P, O and C.

Conductive lines 180 may be formed on the variable resistance patterns 160. The conductive lines 180 may serve as a bit line BL. The conductive lines 180 may extend along the second direction. Upper electrodes 170 may be between the conductive lines 180 and the variable resistance patterns 160. The upper electrodes 170 may extend along the second. Contact plugs (not shown) may be formed between the upper electrodes 170 and the conductive lines 180. The upper electrodes 170 may be, for example, the same material as the lower electrodes 141.

During operation of the memory device, an electric current supplied from the conductive line 180 may be delivered to the third doped regions 130 via the variable resistance pattern 160 and the lower electrode 141. Hereinafter, an emitter current $I_e$ will refer to an electric current passing through the third doped region 130, a collector current $I_c$ will refer to an electric current delivered to the first doped region 109 via the second doped region 103, and a base current $I_b$ will refer to will refer to an electric current given by subtracting the collector current $I_c$ from the emitter current $I_e$. According to some example embodiments of the inventive concepts, an electric current supplied from the conductive line 180 may not flow through the second doped region 103 and a portion thereof may flow to the first doped region 109, unlike the case of using a diode as the selection device.

In the case that a plurality of memory cells are connected to one word line in common, portions of the word line between such memory cells may serve as resistors. A relatively high voltage may be needed to normally operate memory cells located relatively far away from a word line contact plug. As the result of the high voltage, an increase in operation voltage of memory cells and/or deterioration in reliability of peripheral driving circuits may occur. According to some example embodiments of the inventive concepts, due to the collector current $I_c$, an electric current flowing through the word line may be reduced relatively. Less voltage may be applied to portions of the word line located between the memory cells and a voltage applied to the bit line may reduce relatively. In some embodiments, the first doped region 109 may be grounded.

In the case that the second doped region 103 (e.g., the base B) is a heavily doped region, a leakage current may increase between the second doped regions 103 and the third doped regions 130. In addition, a current gain β representing a ratio of $I_c$ to $I_b$ may decrease. In the case that the base B is a lightly doped region, a carrier concentration may decrease and a resistance of the word lines may increase. These difficulties may be overcome by a word line strapping technique, which may include additional electric connections every several memory cells. An increase of chip size may be needed to realize the word line strapping technique. According to some example embodiments, the aforementioned increase in electric resistance of the word line may be suppressed and/or reduced, because the first metal silicide patterns 120 is provided on the second doped regions 103. A main portion $I_{b2}$ of the base current $I_b$ may be delivered via the first metal silicide patterns 120 with a relatively high conductance, and a minor portion $I_{b1}$ thereof may be delivered via the lightly doped region 101. A total resistance of the word line may be decreased in comparison to a case where the first metal silicide patterns 120 are not provided on the second doped regions 103. According to example embodiments, because the third doped region 130 is in direct contact with the lightly doped region 101 with a lower impurity concentration than the heavily doped region 102, a breakdown voltage between the second and third doped regions 103 and 130 can be less than a case where the third doped region 130 is in directly contact with the heavily doped region 102.

The main portion $I_{b2}$ of the base current $I_b$ may be greater than the minor portion $I_{b1}$ thereof. Most of the base current $I_b$ may be delivered via the first metal silicide pattern 120 and a specific portion thereunder, and the lightly doped region 101 of the second conductivity type may be used as a path for a small portion of the electric current (e.g., $I_c$) delivered to the first doped region 109. A thickness of a portion, practically serving as the base B, may be relatively thin enough to realize a short base structure.

The heavily doped region 102 may contribute to lower a Schottky barrier height between the lightly doped region 101 and the first metal silicide pattern 120. Because the lightly doped region 101 may be connected to the first metal silicide pattern 120 via the heavily doped region 102 and may not be in direct contact with the first metal silicide pattern 120, the Schottky barrier height between the lightly doped region 101 and the first metal silicide pattern 120 may be lowered. A large portion of the emitter current $I_e$ may be delivered to the first metal silicide pattern 120. A portion $I_{b3}$ of the base current $I_b$ may flow via the heavily doped region 102.

Figure 4:
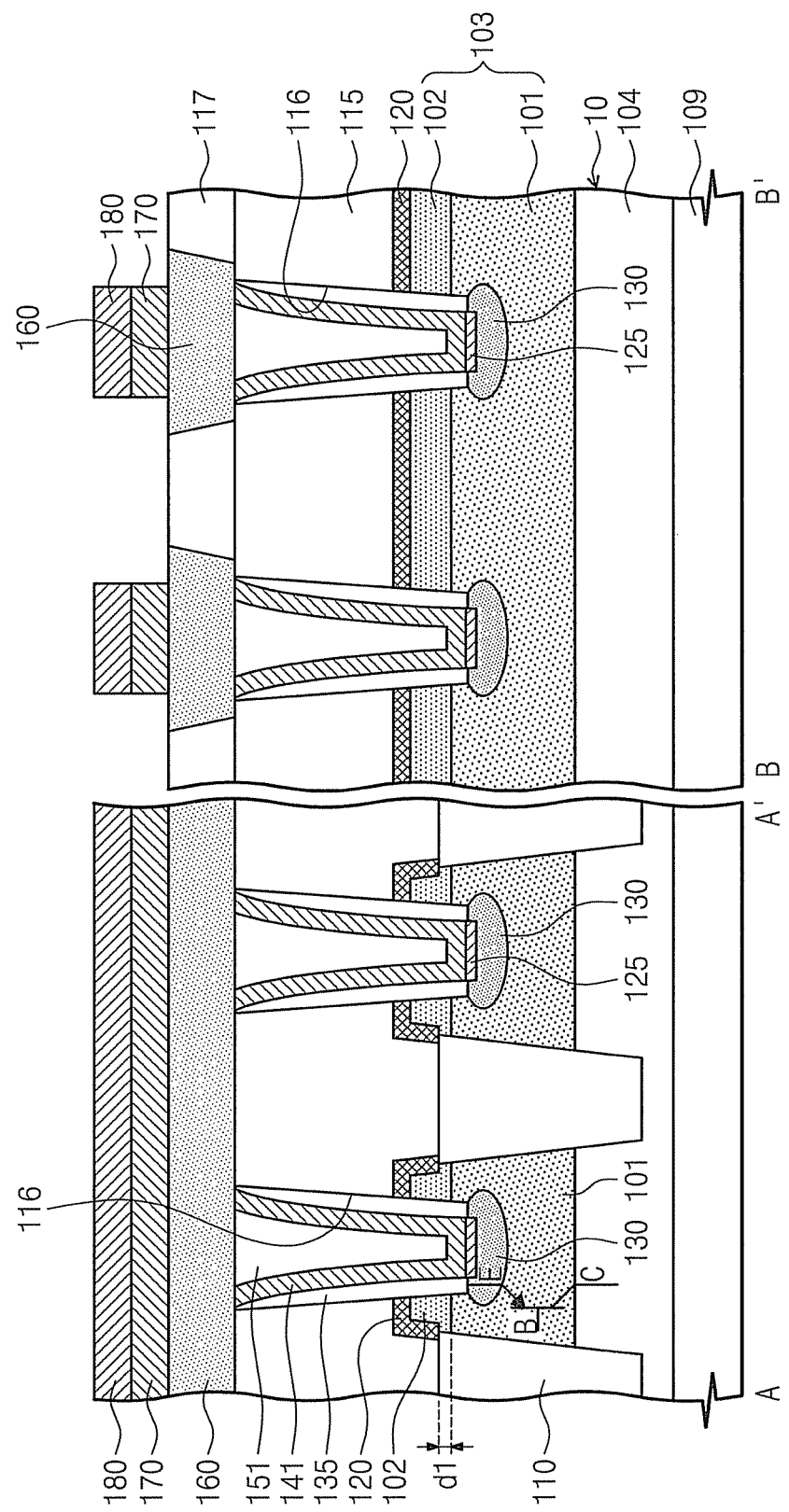

FIG. 4 is a cross-sectional diagram illustrating VRMDs according to other example embodiments. For conciseness, overlapping description of elements previously described with reference to FIGS. 1-3 may be omitted. A fourth doped region 104 may be between the second doped region 103 and the first doped region 109. The fourth doped region 104 may be an impurity region heavily doped with impurities of the first conductivity type. According to some example embodiments, the fourth doped region 104 may be used as a portion of the collector C. Second metal silicide patterns 125 may be between the lower electrodes 141 and the third doped regions 130. The second metal silicide pattern 125 may contribute to realizing an ohmic contact between the third doped region 130 and the lower electrode 141. According to some example embodiments, the second metal silicide patterns 125 may be, for example, cobalt silicide.

Figure 5:
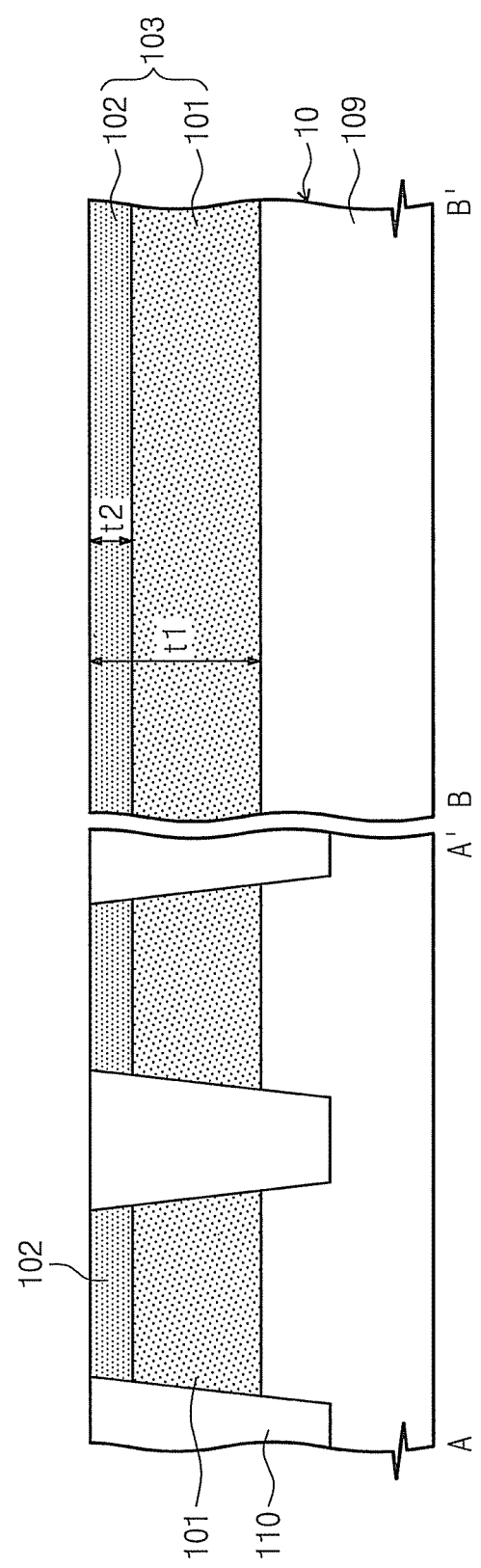

FIGS. 5-10 are cross-sectional diagrams illustrating methods of fabricating VRMDs according to example embodiments. Referring to FIG. 5, a first doped region 109 and second doped regions 103 may be formed in a substrate 10. The substrate 10 may be a semiconductor-based structure. For example, the substrate 10 may be one of silicon, silicon germanium (SiGe), germanium (Ge), and/or gallium arsenic (GaAs). A silicon-on-insulator (SOI) wafer may be used as the substrate 10. The substrate 10 may be doped with impurities of a first conductivity type. For example, the substrate 10 may be a p-type silicon wafer lightly doped with p-type impurities.

The substrate 10 of the first conductivity type may be used as the first doped region 109. The first doped region 109 may be formed by doping the substrate 10 with p-type impurities. A fourth doped region (not shown) may be formed between the first doped region 109 and the second doped region 103, as described with respect to FIG. 4. The formation of the second doped regions 103 may include forming the lightly doped region 101 of the second conductivity type and forming the heavily doped region 102 of the second conductivity type. The formation of the lightly doped region 101 may include lightly doping the substrate 10 with impurities of the second conductivity type to a first depth t1 from a top surface of the substrate 10, and the formation of the heavily doped region 102 may include heavily doping the substrate 10 with impurities of the second conductivity type to a second depth t2 from the substrate 10. The second depth t2 may be less than the first depth t1. The formation of the second doped region 103 or other doped regions according to example embodiments may be performed using, for example, at least one of an ion implantation technique and a diffusion technique.

Device isolation layers 110 may be formed in the substrate 10 to confine sidewalls of the second doped regions 103. A thickness of the device isolation layer 110 may be greater than the second depth t1 and/or t2. The device isolation layers 110 may be formed with a bottom surface lower than an interfacial boundary between the second doped region 103 and the first doped region 109. The device isolation layers 110 may be formed using, for example, a shallow trench isolation (STI) process. The device isolation layers 110 may include, for example, a silicon oxide layer. According to example embodiments, a deposition technique with a gap-fill property (e.g., a high density plasma chemical vapor deposition (HDP CVD)) may be used to form a silicon oxide layer for the device isolation layers 110. The device isolation layer 110 may be formed to extend along the first direction, and the second doped regions 103 may also extend along the first direction because they are confined by the device isolation layers 110.

Figure 6:
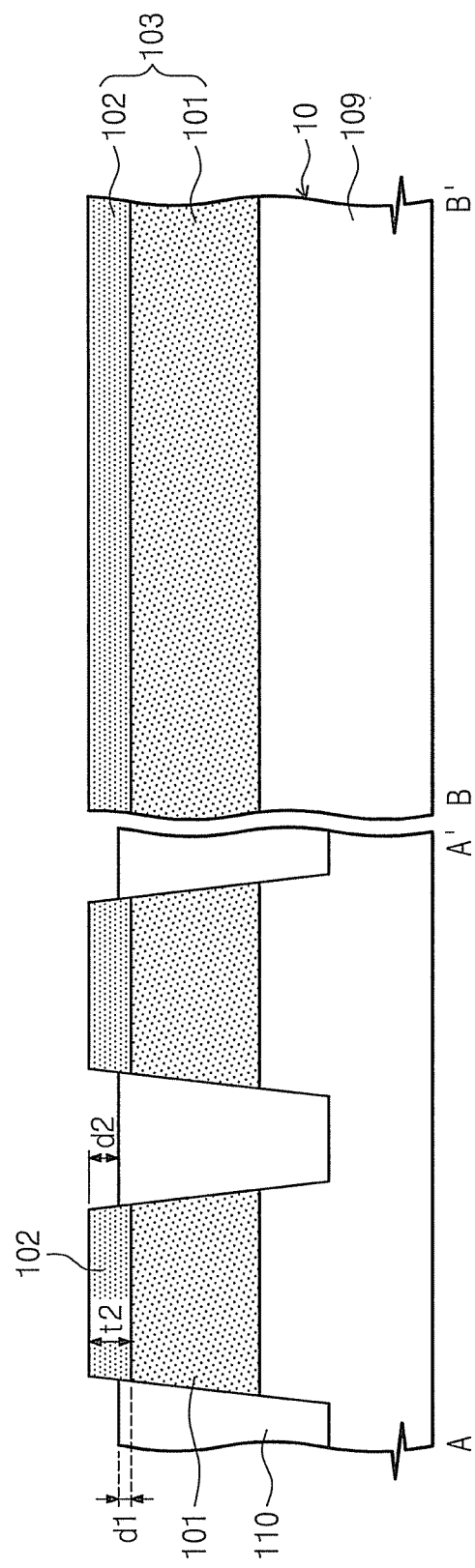

Referring to FIG. 6, top surfaces of the device isolation layers 110 may be recessed to a depth d2. The device isolation layers 110 may be recessed so as not to expose the lightly doped region 101. The recess depth d2 may be less than the thickness t2 of heavily doped region 102. According to some example embodiments, the top surface of the device isolation layer 110 may be higher than an interfacial boundary between the heavily doped region 102 and the lightly doped region 101 by a distance d1.

Figure 7:
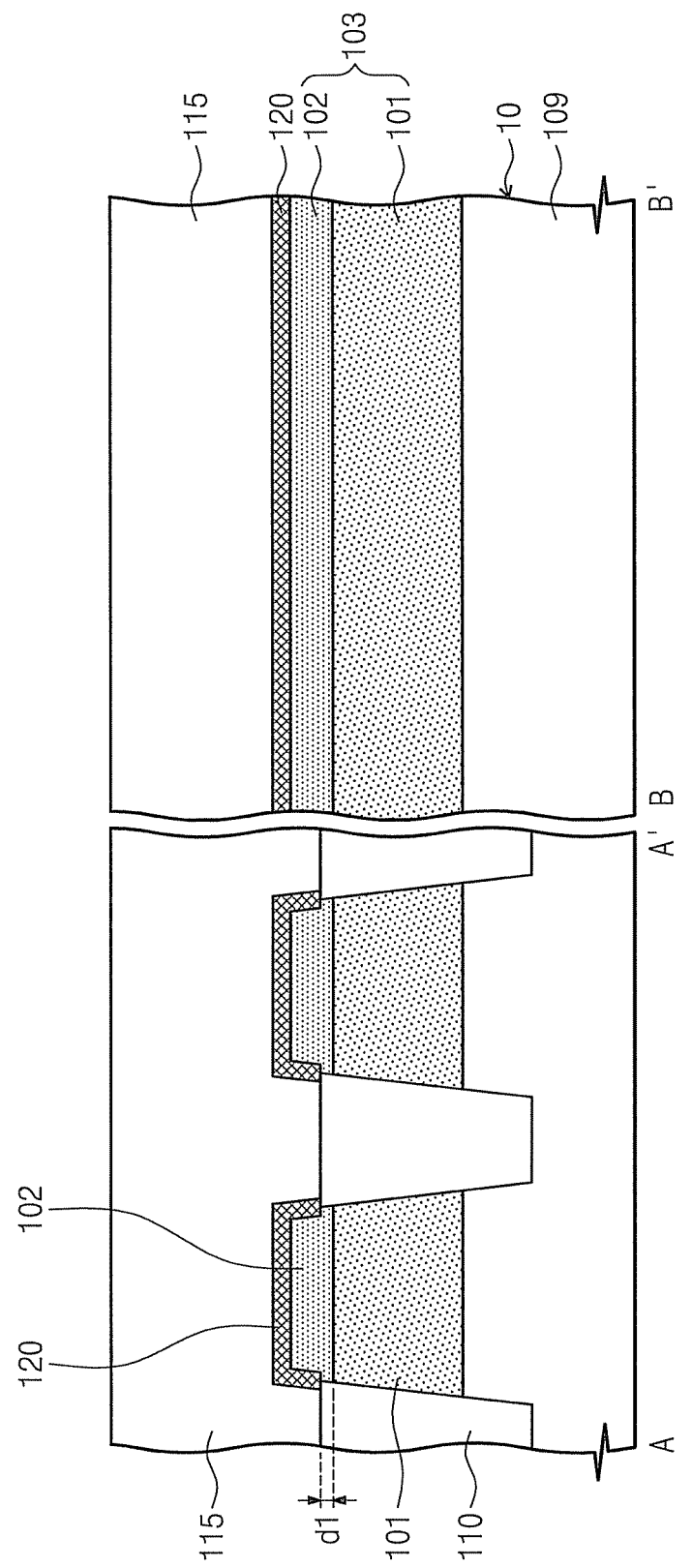

Referring to FIG. 7, first metal silicide patterns 120 may be formed on the heavily doped region 102 of the second conductivity type. The formation of the first metal silicide patterns 120 may include forming a metal layer to cover the substrate 10 and performing a thermal treatment and/or process. After the formation of the first metal silicide patterns 120, a remainder of the metal layer, which does not participate in a silicidation reaction, may be selectively removed. Because the top surface of the device isolation layer 110 is higher by the distance d1 than a bottom surface of the heavily doped region 102, the first metal silicide patterns 120 may be formed spaced apart from the lightly doped region 101. The first metal silicide patterns 120 may be formed on the second doped regions 103 along the first direction. The first metal silicide patterns 120 may be formed of a metal silicide, for example, a cobalt silicide, a nickel silicide and/or a titanium silicide. A first interlayer dielectric 115 may be formed on a resultant structure provided with the first metal silicide patterns 120. The first interlayer dielectric 115 may be formed of, for example, an oxide.

Figure 8:
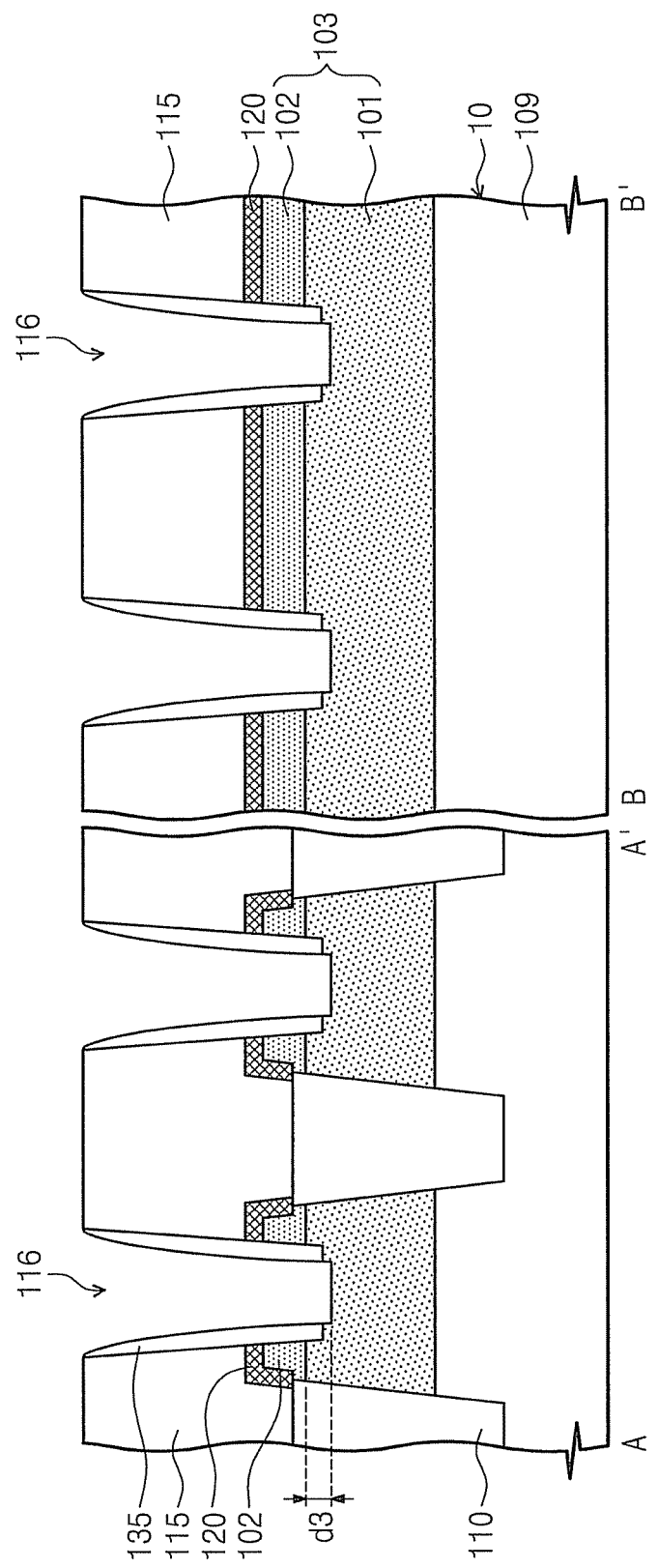

Referring to FIG. 8, contact holes 116 may be formed to expose the lightly doped region 101. For example, the contact holes 116 may be formed to penetrate the first interlayer dielectric 115, the first metal silicide pattern 120, and the heavily doped region 102. Insulating spacers 135 may be formed on inner sidewalls of the contact holes 116. The formation of the insulating spacer 135 may include, for example, forming insulating layer (not shown) on the resultant structure provided with the contact holes 116 and anisotropically etching the insulating layer using a plasma. During the etch step, an initial bottom surface of the contact hole may be recessed to a depth. For example, a final bottom surface of the contact hole 116 may be lower by a depth d3 than an interfacial boundary between the lightly doped region 101 and the heavily doped region 102. The bottom surface of the contact hole 116 may be positioned in the lightly doped region 101.

The formation of the contact holes 116 may include, for example, a first etch step using the first metal silicide patterns 120 as an etch stop layer and a second etch step configured to etch the heavily doped region 102 to expose the lightly doped region 101. Because the first metal silicide patterns 120 may be an etch stop, a depth of the contact hole 116 may be easily controlled without serious spatial variation.

Figure 9:
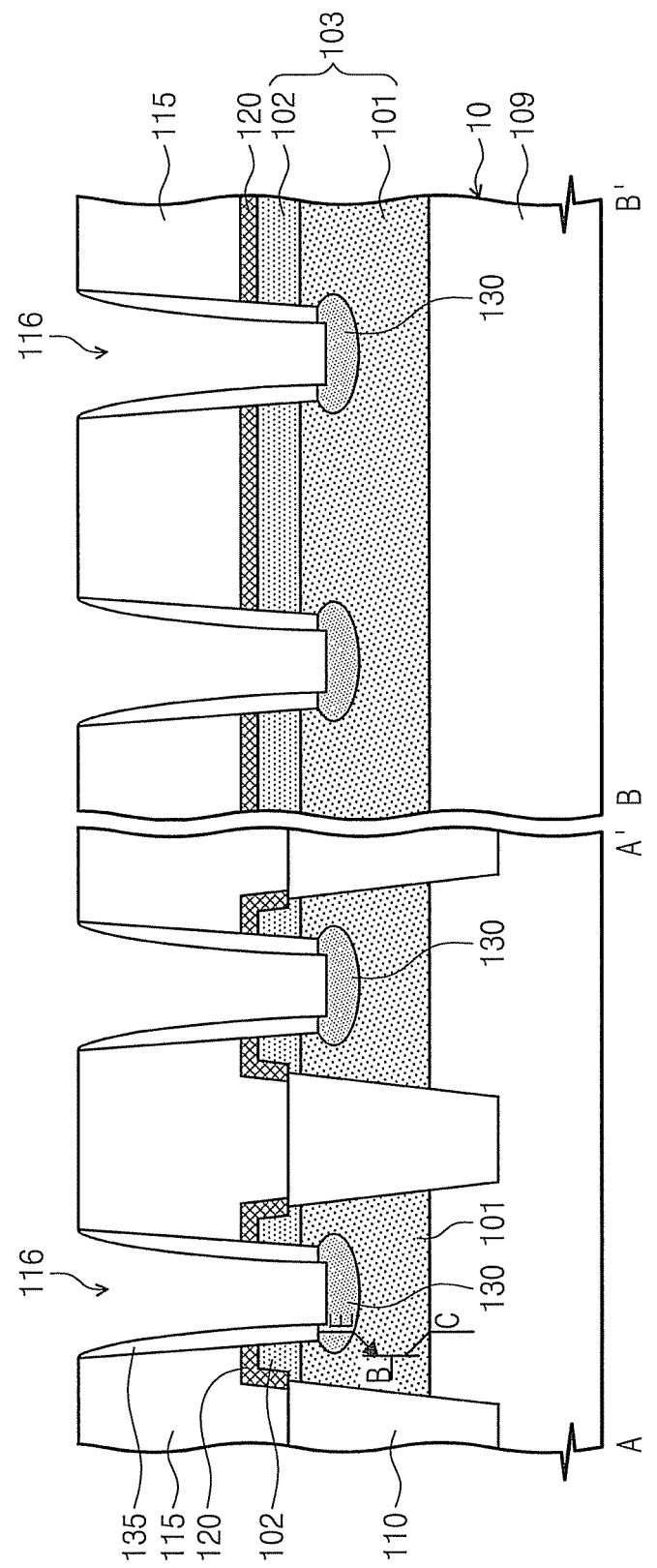

Referring to FIG. 9, third doped regions 130 may be formed in the lightly doped region 101. The third doped regions 130 may be formed by heavily doping portions of the lightly doped region 101 exposed by the contact holes 116 with impurities of the first conductivity type. The third doped regions 130 may be formed to be spaced apart from the heavily doped region 102.

Figure 10:
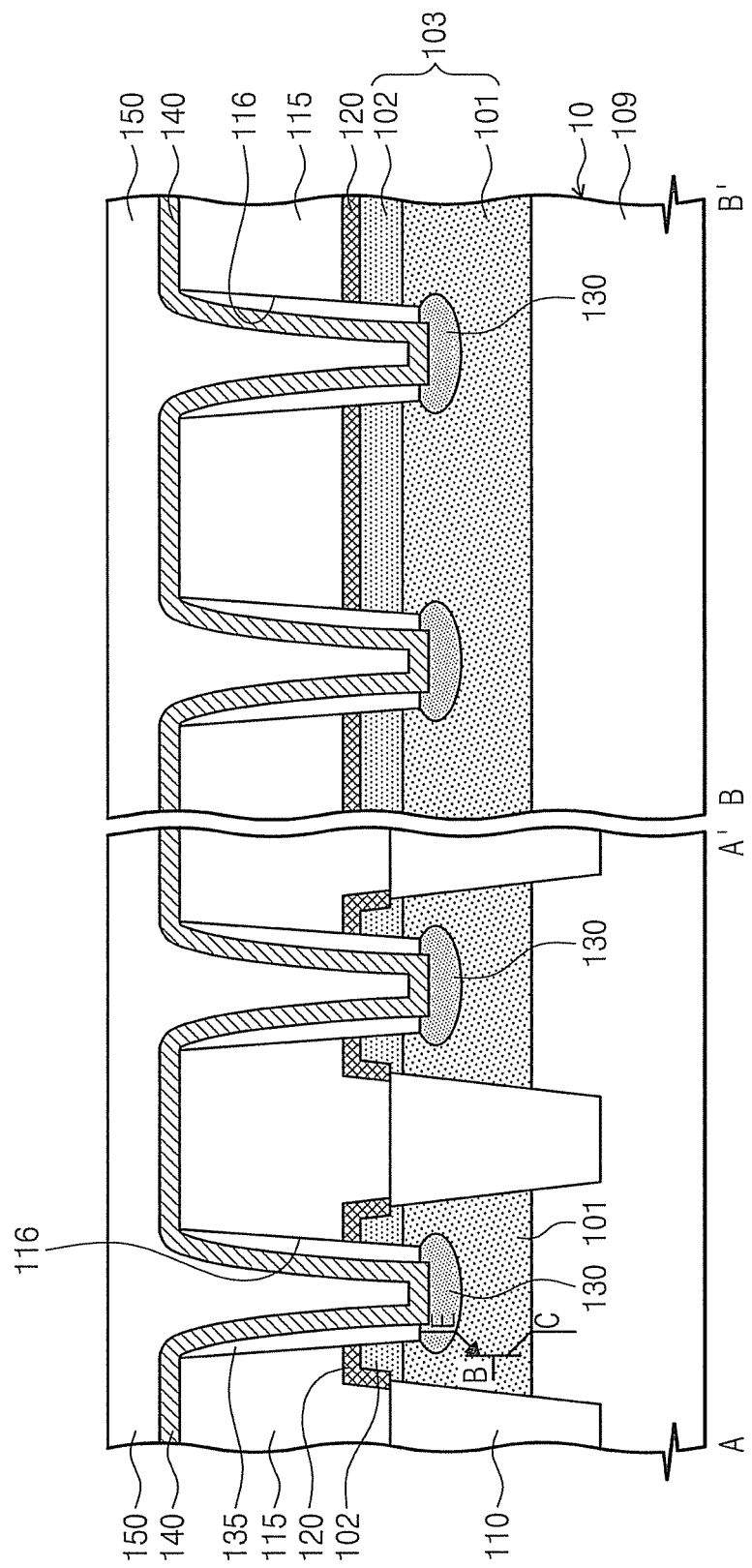

Referring to FIG. 10, a conductive layer 140 and an insulating layer 150 may be formed in the contact holes 116. The conductive layer 140 may include at least one of a transition metal, a conductive transition metal nitride, and a conductive ternary nitride. The transition metal may include at least one of titanium (Ti), zirconium (Zr), hafnium (Hf), vanadium (V), niobium (Nb), tantalum (Ta), and tungsten (W). The conductive transition metal nitride may include at least one of a titanium nitride (TiN), a hafnium nitride (HfN), a vanadium nitride (VN), a niobium nitride (NbN), a tantalum nitride (TaN), and a tungsten nitride (WN). The conductive ternary nitride may include at least one of a titanium aluminum nitride (TiAlN), a titanium carbon nitride (TiCN), a tantalum carbon nitride (TaCN), a titanium silicon nitride (TiSiN) and a tantalum silicon nitride (TaSiN). The insulating layer 150 may include at least one of a silicon oxide, a silicon nitride, and a silicon oxynitride. The conductive layer 140 and the insulating layer 150 may be formed using, for example, a CVD and/or sputtering technique.

Referring to FIG. 3, a planarization process may be performed on the resultant structure including the conductive layer 140 and the insulating layer 150. The planarization process may be performed using, for example, a chemical mechanical polishing (CMP) and/or an etch-back process. The planarization process may be performed until the first interlayer dielectric 115 is exposed. Lower electrodes 141 and insulating gap-fill patterns 151 may be formed in the contact holes 116 by the planarization process. Variable resistance patterns 160 may be formed on the lower electrodes 141. According to some example embodiments, the variable resistance pattern 160 may be formed with a sidewall confined by a second interlayer dielectric 117. A shape of the lower electrode 141 may be variously modified in consideration of an electric connection between the lower electrodes 141 and the variable resistance pattern 160.

Conductive lines 180 may be formed on the variable resistance patterns 160. The conductive lines 180 may be formed to extend along the second direction. Upper electrodes 170 may be formed between the conductive lines 180 and the variable resistance patterns 160. The upper electrodes 170 may be formed of, for example, the same material as the lower electrodes 141.

Figure 11:
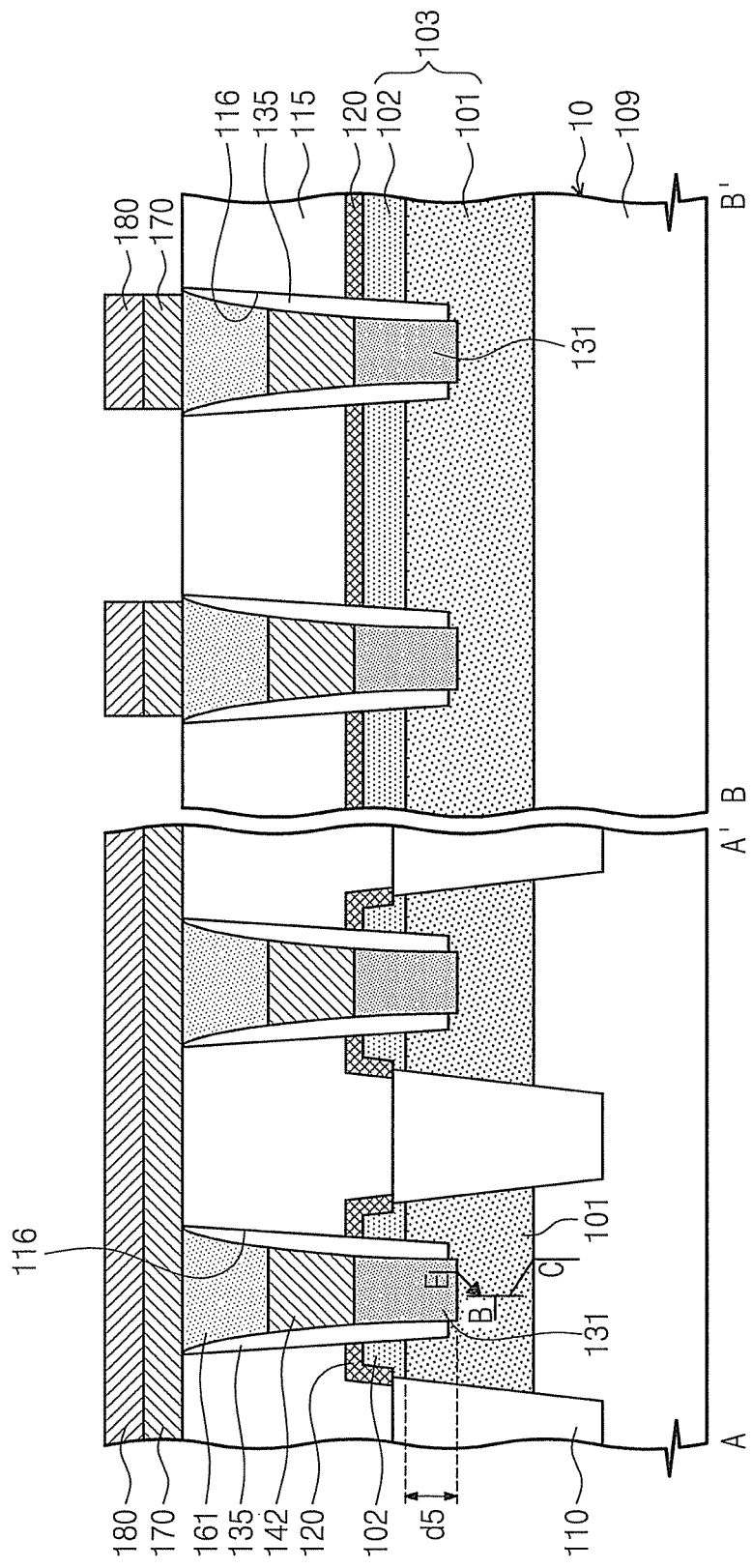

FIG. 11 is a cross-sectional diagram illustrating VRMDs according to still other example embodiments. For conciseness, overlapping description of elements previously described with reference to FIGS. 1-10 may be omitted. Referring to FIG. 11, third doped regions 131 may be provided in the contact holes 116 described with reference to FIG. 8. The formation of the third doped regions 131 may include, for example, forming a semiconductor epitaxial layer using a selective epitaxial growth (SEG) technique. The semiconductor epitaxial layer may be grown using the lightly doped region 101 exposed by the contact holes 116 as a seed layer. A bottom surface of the contact hole 116 may be lower by a specific depth d5 than an interfacial boundary between the lightly doped region 101 and the heavily doped region 102. The depth d5 may be greater than the depth d3 of the contact hole 116 of FIG. 8. The third doped region 131 may partially fill the contact hole 116.

The third doped region 131 may be a heavily doped region of the first conductivity type. The third doped regions 131 may be formed using, for example, an in-situ doping method during the formation of the semiconductor epitaxial layer. The third doped regions 131 may be formed by, for example, an ion implantation process, which may be performed after the formation of the semiconductor epitaxial layer. Lower electrodes 142 may be formed on the third doped regions 131. Each of the lower electrodes 142 may be formed in a corresponding one of the contact holes 116. For example, the formation of the lower electrodes 142 may include forming a lower electrode layer on the resultant structure including the third doped regions 131 to fill the contact holes 116 and performing an etch-back process to etch the lower electrode layer. According to some example embodiments, a top surface of the lower electrodes 142 may be below a top surface of the first interlayer dielectric 115 according to the etch-back process.

Variable resistance patterns 161 may be formed on the lower electrodes 142. According to some example embodiments, each of the variable resistance patterns 161 may be formed in a corresponding one of the contact holes 116. According to some example embodiments, the variable resistance patterns 161 may be formed by, for example, a damascene process. For example, the formation of the variable resistance patterns 161 may include forming a variable resistance layer to fill the contact holes 116 and performing a planarization process on the variable resistance layer to expose at least a top surface of the first interlayer dielectric 115.

Figure 12:
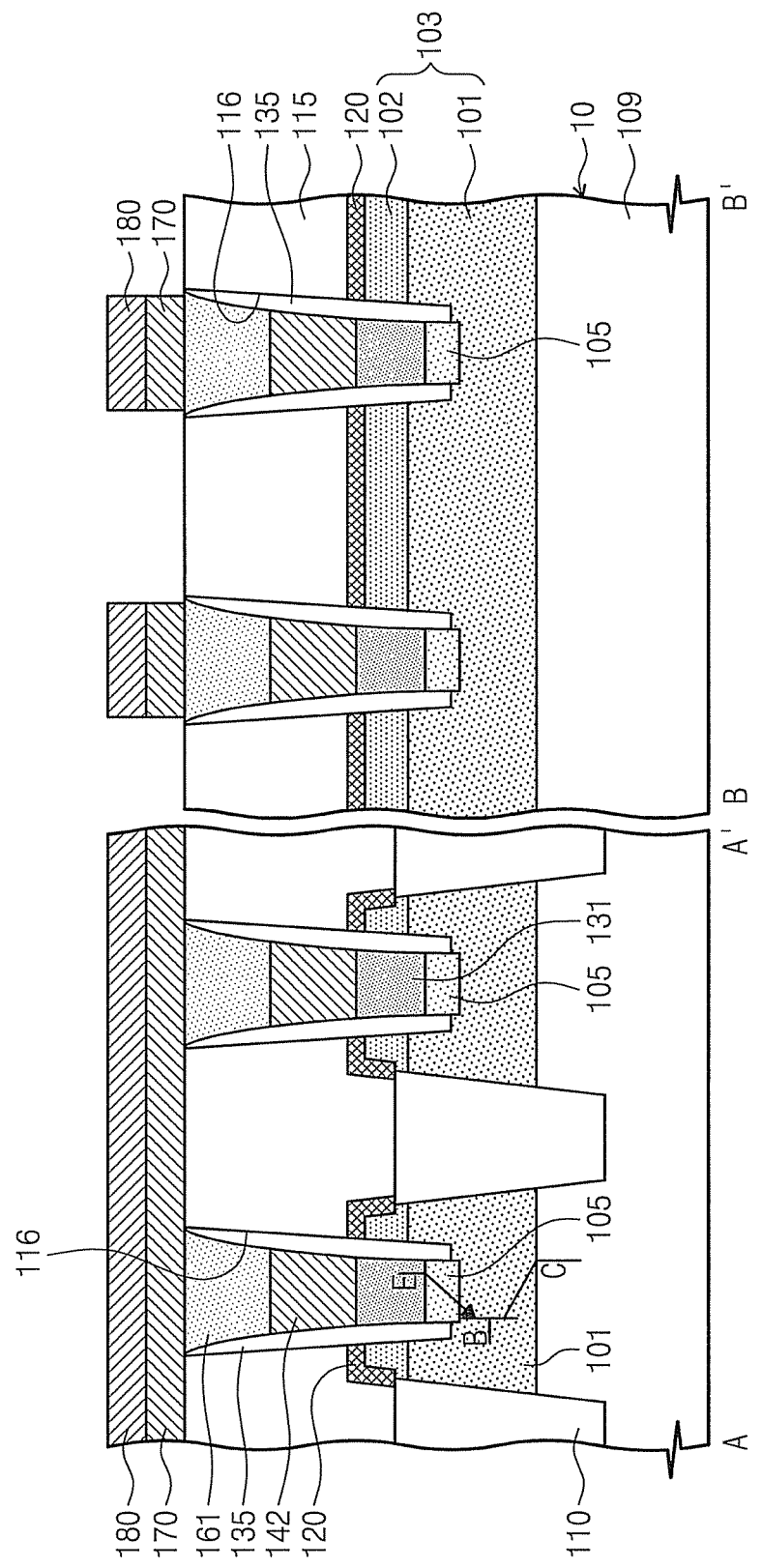

FIG. 12 is a cross-sectional diagram illustrating VRMDs according to further example embodiments. Referring to FIG. 12, fifth doped regions 105 may be formed between the third doped regions 131 and the lightly doped region 101. The fifth doped region 105 may be an impurity region lightly doped with impurities of the second conductivity type. According to some example embodiments, the fifth doped region 105 may include substantially the same impurity concentration as the lightly doped region 101. The formation of the fifth doped region 105 may include forming a semiconductor epitaxial layer on the lightly doped region 101 exposed by the contact holes 116 described with reference to FIG. 8 and may be performed using a SEG technique.

According to some example embodiments, the fifth doped region 105 and the third doped region 131 may be formed at lower and upper portions, respectively, of the semiconductor epitaxial layer. The third doped region 131 may be an impurity region heavily doped with impurities of the first conductivity type. The third doped region 131 and the fifth doped region 105 may be formed using, for example, an in-situ doping method during the formation of the semiconductor epitaxial layer. The third doped region 131 and the fifth doped region 105 may be formed by, for example, ion implantation processes performed after the formation of the semiconductor epitaxial layer. The fifth doped region 105 in conjunction with the second doped regions 103 may be used as the base B of the BJT.

Figure 13:
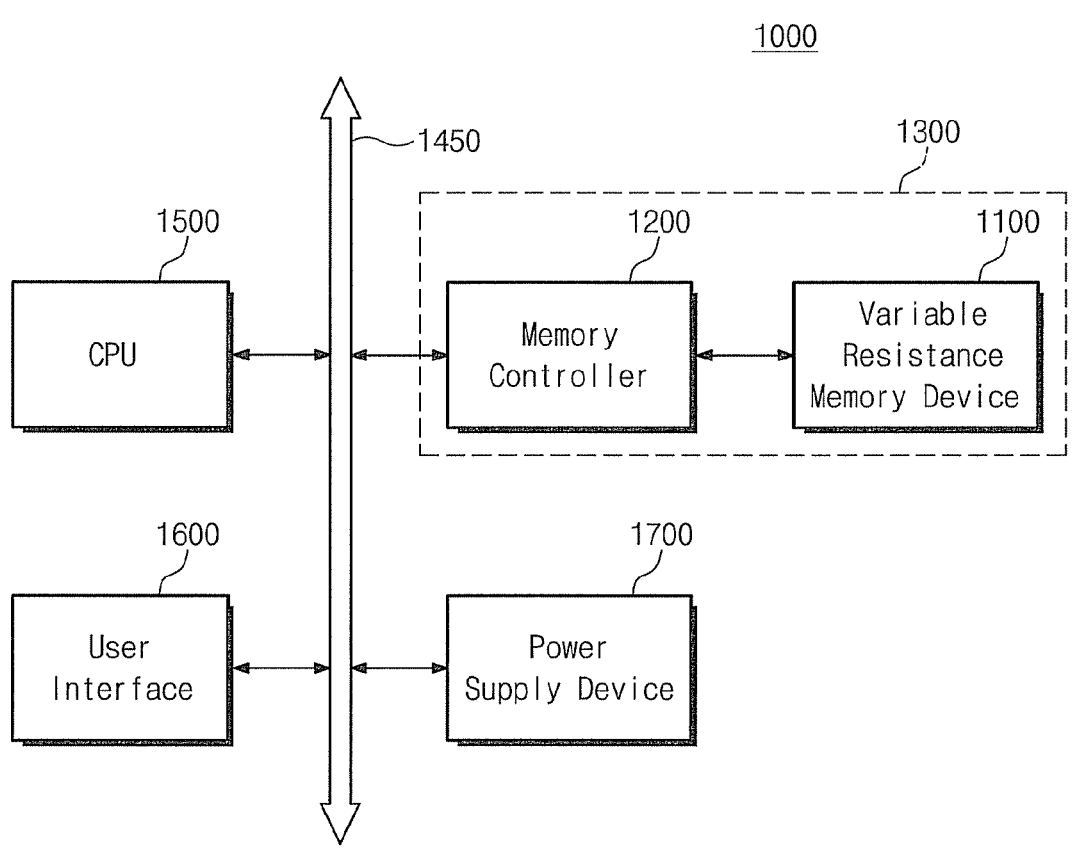

FIG. 13 is a block diagram illustrating a memory system 1000 including a VRMD according to example embodiments. Referring to FIG. 13, a memory system 1000 may include a semiconductor memory device 1300 including a VRMD 1100 and a memory controller 1200, a central processing unit (CPU) 1500, a user interface 1600, and a power supply device 1700, which may be connected by a system bus 1450. The VRMD 1100 may be a VRMD according to example embodiments described with respect to FIGS. 1-12. Data processed by the CPU 1500 and/or input from the user interface 1600 may be stored in the VRMD 1100, and the memory controller 1200 may be configured to control data exchange among the CPU 1500, the user interface 1600, and the VRMD 1100.

According to some example embodiments, the VRMD 1100 may constitute a solid state drive (SSD), and in this case, a writing speed of the memory system 1000 may be increased. It is apparent to one of ordinary skill in the art that a memory system 1000 according to some embodiments of the inventive concepts may further include an application chipset (not shown), a camera image processor (CIS) (not shown), a mobile DRAM (not shown) and/or an input/output device (not shown). A VRMD and/or a memory system of example embodiments of the inventive concepts may be applied to, for example, a personal digital assistant (PDA), a portable computer, a web tablet, a wireless phone, a mobile phone, a digital music player, a memory card and/or all devices that can transmit and/or receive data in a wireless communication environment.

A VRMD and/or a memory system of example embodiments of the inventive concepts may be mounted using various kinds of packages. For example, the VRMD and/or the memory system may be mounted by various package types, for example, Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

According to example embodiments, a VRMD may have a decreased operation voltage an increased capacity, and/or enhanced reliability. While example embodiments have been particularly shown and described, it will be understood by one of ordinary skill in the art that variations in form and detail may be made therein without departing from the spirit and scope of the claims.

What is claimed is:

1. A variable resistance memory device, comprising:
   a semiconductor layer including a first doped region of a first conductivity type, at least one second doped region of a second conductivity type, and at least one third doped region of the first conductivity type, the first doped region being spaced apart from the third doped region, the second doped region being between the first and third doped regions;
   a variable resistance pattern on the semiconductor layer;
   at least one lower electrode between the semiconductor layer and the variable resistance pattern; and
   a first metal silicide pattern in contact with the semiconductor layer, the first metal silicide pattern being spaced apart from the third doped region, the second doped region being in contact with the first metal silicide pattern, wherein
   the first metal silicide pattern is spaced apart from the lower electrode and the first doped region, and
   the lower electrode is spaced apart from the second doped region.

2. The device of claim 1, wherein the second doped region includes a lightly doped region in contact with the third doped region and a heavily doped region spaced apart from the third doped region.

3. The device of claim 2, wherein the first metal silicide pattern is in contact with the heavily doped region and spaced apart from the lightly doped region.

4. The device of claim 2, wherein:
the lightly doped region is on the first doped region;
the heavily doped region is on the lightly doped region; and
the first metal silicide pattern is on the heavily doped region.

5. The device of claim 2, wherein:
a contact hole penetrates the first metal silicide pattern and the heavily doped region to expose the lightly doped region; and
the third doped region is in the lightly doped region exposed by the contact hole.

6. The device of claim 2, wherein:
a contact hole penetrates the first metal silicide pattern and the heavily doped region to expose the lightly doped region; and
the third doped region is on the lightly doped region in the contact hole.

7. The device of claim 6, further comprising:
an insulating spacer on a sidewall in the contact hole, the sidewall including surfaces of the first metal silicide pattern and the heavily doped region.

8. The device of claim 1, further comprising:
conductive lines on the variable resistance pattern,
wherein the first metal silicide pattern extends in a first direction, and
the conductive lines extend across the first metal silicide pattern in a second direction.

9. A memory system, comprising:
a processing unit;
a memory controller;
the variable resistance memory device of claim 1 connected to the memory controller;
a user interface;
a power supply device; and
a bus connecting the processing unit, the memory controller, the user interface and the power supply device.

10. A variable resistance memory device, comprising:
a semiconductor layer;
a variable resistance element on the semiconductor layer;
a bipolar junction transistor (BJT) at least partially in the semiconductor layer, an emitter of the BJT connected to an electrode of the variable resistance element; and
a silicide layer on the semiconductor layer, a base of the BJT being connected to the silicide layer, the base and the emitter separating the variable resistance element from the silicide layer, wherein
a collector of the BJT is connected to ground,
the base includes a lightly doped region of the semiconductor layer and a highly doped region of the semiconductor layer,
the silicide layer is on the highly doped region, and
the emitter is surrounded by the lightly doped region.

11. A variable resistance memory device, comprising:
a semiconductor layer;
a variable resistance element on the semiconductor layer;
a bipolar junction transistor (BJT) at least partially in the semiconductor layer, an emitter of the BJT connected to an electrode of the variable resistance element; and
a silicide layer on the semiconductor layer, a base of the BJT being connected to the silicide layer, the base and the emitter separating the variable resistance element from the silicide layer, wherein
a collector of the BJT is connected to ground,
the base includes a lightly doped region of the semiconductor layer and a highly doped region of the semiconductor layer,
the silicide layer is on the highly doped region,
a contact hole penetrates the highly doped region to expose the lightly doped region, and
the emitter is on the lightly doped region in the contact hole, the emitter being separated from the highly doped region by at least the lightly doped region.

\* \* \* \* \*